US009568676B2

(12) United States Patent
Collins et al.

(10) Patent No.: US 9,568,676 B2
(45) Date of Patent: Feb. 14, 2017

(54) METHOD FOR PRODUCING AN INTEGRATED OPTICAL CIRCUIT

(71) Applicant: Caliopa NV, Zwijnaarde (BE)

(72) Inventors: Tom Collins, Munich (DE); Martijn Tassaert, Munich (DE)

(73) Assignee: Caliopa NV, Zwijnaarde (BE)

( * ) Notice: Subject to any disclaimer, the term of this patent is extended or adjusted under 35 U.S.C. 154(b) by 0 days.

(21) Appl. No.: 14/824,759

(22) Filed: Aug. 12, 2015

(65) Prior Publication Data
US 2016/0047983 A1 Feb. 18, 2016

(30) Foreign Application Priority Data
Aug. 13, 2014 (EP) .................................... 14180862

(51) Int. Cl.
*G02B 6/12* (2006.01)
*G02B 6/122* (2006.01)
(Continued)

(52) U.S. Cl.
CPC ......... *G02B 6/1228* (2013.01); *G02B 6/12002* (2013.01); *G02B 6/12004* (2013.01);
(Continued)

(58) Field of Classification Search
CPC . G02B 6/12019; G02B 6/12007; G02B 6/131; G02B 6/132; G02B 6/12021
See application file for complete search history.

(56) References Cited

U.S. PATENT DOCUMENTS 5,358,896 A 10/1994 Komatsu et al.
6,052,397 A 4/2000 Jeon et al.
(Continued)

FOREIGN PATENT DOCUMENTS

JP H03242988 A 10/1991
JP H06174982 A 6/1994
(Continued)

OTHER PUBLICATIONS

Binsma et al., "MOVPE Waveguide Regrowth in InGaAsP/InP with Extremely Low Butt-Joint Loss," Proc. Symp. IEEE/LEOS Benelux Chapter, pp. 245-248 (2001).
(Continued)

*Primary Examiner* — Thomas A Hollweg
*Assistant Examiner* — Mary A El Shammaa
(74) *Attorney, Agent, or Firm* — Leydig, Voit & Mayer, Ltd.

(57) ABSTRACT

A method for producing an integrated optical circuit comprising an active device and a passive waveguide circuit includes: applying an active waveguide structure on a source wafer substrate; exposing a portion of the source wafer substrate by selectively removing the active waveguide structure; applying a passive waveguide structure on the exposed portion of the source wafer substrate, wherein an aggregation of the active waveguide structure and the passive waveguide structure forms the active device, the active device having a bottom surface facing the source wafer substrate; removing the source wafer substrate from the active device; and attaching the active device to a target substrate comprising the passive waveguide circuit such that the bottom surface of the active device faces the target substrate.

6 Claims, 14 Drawing Sheets

(51) Int. Cl.
G02B 6/13 (2006.01)
H01S 3/063 (2006.01)
H01S 5/22 (2006.01)
G02B 6/42 (2006.01)

(52) U.S. Cl.
CPC .............. *G02B 6/13* (2013.01); *G02B 6/131* (2013.01); *G02B 6/4257* (2013.01); *H01S 3/0637* (2013.01); *H01S 5/2206* (2013.01); *H01S 5/2207* (2013.01); *H01S 5/2209* (2013.01); *G02B 2006/12078* (2013.01); *G02B 2006/12128* (2013.01); *G02B 2006/12173* (2013.01); *G02B 2006/12176* (2013.01); *G02B 2006/12178* (2013.01)

(56) References Cited

U.S. PATENT DOCUMENTS

| | | | |
|---|---|---|---|
| 6,985,648 B2* | 1/2006 | Kish, Jr. | B82Y 20/00 385/1 |
| 7,065,266 B2* | 6/2006 | Joyner | G02B 6/12011 385/129 |
| 2002/0036055 A1 | 3/2002 | Yoshimura et al. | |
| 2003/0095736 A1* | 5/2003 | Kish, Jr. | B82Y 20/00 385/14 |
| 2004/0119079 A1 | 6/2004 | Hayakawa et al. | |
| 2007/0230886 A1 | 10/2007 | Chen et al. | |
| 2008/0080808 A1 | 4/2008 | Tolshikhin et al. | |
| 2010/0226605 A1 | 9/2010 | Kikuchi et al. | |
| 2011/0135314 A1* | 6/2011 | Tolstikhin | H01S 5/5018 398/149 |

FOREIGN PATENT DOCUMENTS

| | | |
|---|---|---|
| JP | H077148 A | 1/1995 |
| JP | H10117045 A | 5/1998 |
| JP | H10221554 A | 8/1998 |
| JP | H11223739 A | 8/1999 |
| JP | 2001274528 A | 10/2001 |
| JP | 2003069134 A | 3/2003 |
| JP | 2004235600 A | 8/2004 |
| JP | 2008147209 A | 6/2008 |
| JP | 2012222193 A | 11/2012 |

OTHER PUBLICATIONS

Yan et al., "Optical Mode Converter Integration With InP—InGaAsP Active and Passive Waveguides Using a Single Regrowth Process," IEEE Photonics Technology Letters, vol. 14, Issue 9, pp. 1249-1251, Institute of Electrical and Electronics Engineers, New York, New York (Sep. 2002).
Barwicz et al., "Polarization-transparent microphotonic devices in the strong confinement limit," Nature Photonics, pp. 57-60, http://www.nature.com/nphoton/journal/v1/n1/full/nphoton.2006.41.html (Dec. 2006).
Gerlach et al., "40 Gbit/s Operation of Laser-Integrated Electroabsorption Modulator Using Identitcal InGaAlAs Quantum Wells," International Conference on Indium Phosphide and Related Materials, pp. 554-557, Institute of Electrical and Electronics Engineers, New York, New York (2005).
Bauters et al., "Ultra-low-loss high-aspect-ratio $Si_3N_4$ waveguides," Optics Express, vol. 19, Issue 4, pp. 3163-3174, Optical Society of America, Washington DC (Feb. 14, 2011).
Bauters et al., "Silicon on ultra-low-loss waveguide photonic integration platform," Optics Express, vol. 21, Issue 1, pp. 544-555, Optical Society of America, Washington DC (Jan. 14, 2013).
Okamoto, "Progress and technical challenge for planar waveguide devices: silica and silicon waveguides," Laser Photonics Rev., vol. 6, Issue 1, pp. 14-23, Wiley-VCH Verlag GmBH & Co. KGaA, Weinheim, Germany (2011).
Zoschke et al, "Polyimide based Temporary Wafer Bonding Technology for High Temperature Compliant TSV Backside Processing and Thin Device Handling," IEEE $62^{nd}$ Electronic Components and Technology Conference (ECTC), pp. 1054-1061, Institute of Electrical and Electronics Engineers, New York, New York (May 29-Jun. 1, 2012).
Chen et al., "Monolithically Integrated 40-Wavelength Demultiplexer and Photodetector Array on Silicon," IEEE Photonics Technology Letters, vol. 23, Issue 12, pp. 869-871, Institute of Electrical and Electronics Engineers, New York, New York (Jul. 1, 2011).
Zhang et al., "MOCVD Regrowth of InP on Hybrid Silicon Substrate," ECS Solid State Letters, vol. 2, Issue 11 (Aug. 30, 2013).
Roelkens et al., "Integration of InP/InGaAsP photodetectors onto silicon-on-insulator waveguide circuits," Optics Express, vol. 13, Issue 25, pp. 10108-10108, Optical Society of America, Washington DC (Dec. 12, 2005).
Park et al., "A hybrid silicon evanescent photodetector," $65^{th}$ Annual Device Research Conference, pp. 185-186, Institute of Electrical and Electronics Engineers, New York, New York (Jun. 18-20, 2007).
Piprek et al., "High Efficiency MQW Electroabsorption Modulators," Proc. of the ECS symposium on Integrated Optoelectronics, vol. 2002-4, pp. 139-149 (2002).
Gondarenko et al., "High Q Silicon Nitride Photonic Cavities," Lasers and Electro-Optics, pp. 1-2, Institute of Electrical and Electronics Engineers, New York, New York (Jun. 2-4, 2009).
Soares et al., "Extremely low-loss vertically-tapered spot size converter in InP-based waveguide structure," Proceedings Symposium IEEE/LEOS Benelux Chapter, pp. 127-130 (2004).
Tang et al., "Energy-Efficient Hybrid Silicon Electroabsorption Modulator for 40-Gb/s 1-V Uncooled Operation," IEEE Photontonics Technology Letters, vol. 24, Issue 19, pp. 1689-1692, Institute of Electrical and Electronics Engineers, New York, New York (Oct. 1, 2012).
Keyvaninia et al, "Demonstration of a heterogeneously integrated III-V/SOI single wavelength tunable laser," Optics Express, vol. 21, Issue 3, pp. 3784-3792, Optical Society of America, Washington DC (Feb. 11, 2013).
Kurczveil et al., "Characterization of Insertion Loss and Back Reflection in Passive Hybrid Silicon Tapers," IEEE Photonics Journal, vol. 5, Issue 2, Institute of Electrical and Electronics Engineers, New York, New York (Apr. 2013).
"Micro-Transfer-Printing (μTP)," Celeprint, http://www.x-celeprint.com/micro-transfer-printing-%C2%B5tp/ (2014).
Fang et al., "A Distributed Bragg Reflector Silicon Evanescent Laser," IEEE Photonics Technology Letters, vol. 20, Issue 20, pp. 1667-1669, Institute of Electrical and Electronics Engineers, New York, New York (Oct. 15, 2008).

* cited by examiner

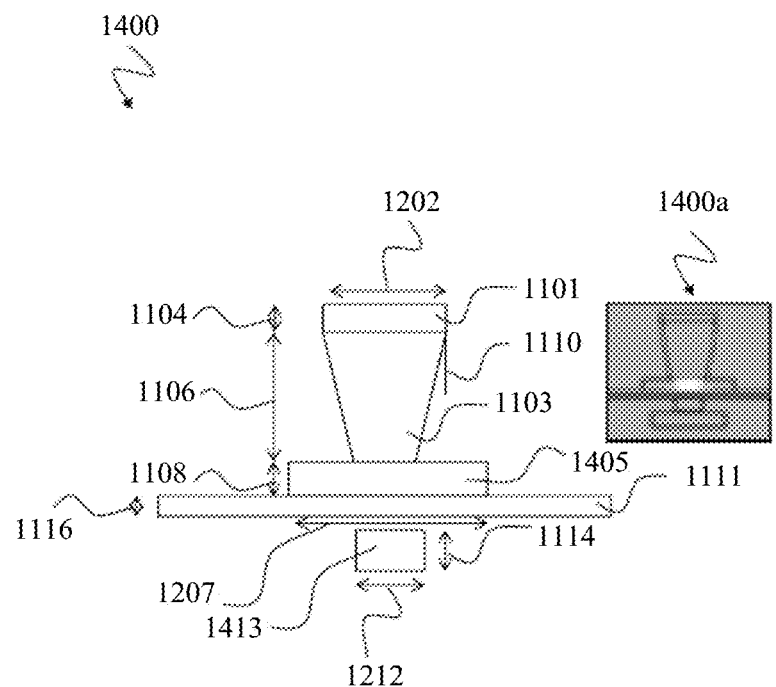
Fig.14
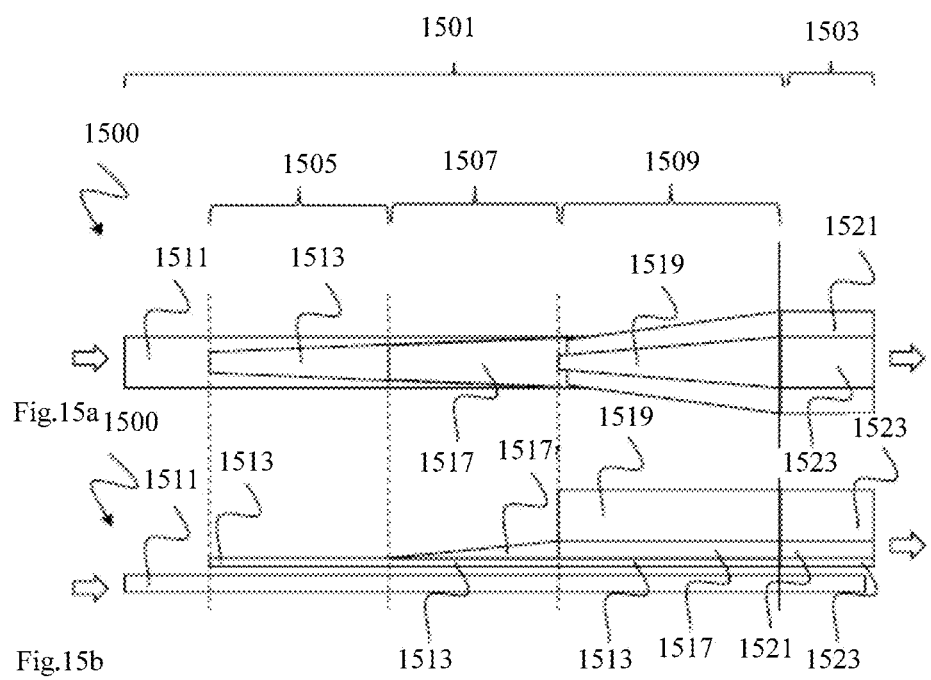
Fig.15a
Fig.15b

METHOD FOR PRODUCING AN INTEGRATED OPTICAL CIRCUIT

CROSS-REFERENCE TO RELATED APPLICATION

This application claims priority to European Patent Application No. EP14180862.6, filed on Aug. 13, 2014, which is hereby incorporated by reference in its entirety.

TECHNICAL FIELD

The present disclosure relates to a method for producing an integrated optical circuit including an active device and a passive waveguide circuit, in particular by heterogeneous integration of III-V actives using passive tapers. The disclosure further relates to an integrated optical circuit, in particular a photonic integrated circuit produced by such method.

BACKGROUND

Silicon photonics is rapidly gaining importance as a generic technology platform for a wide range of applications in telecommunications, data communications, interconnect and sensing. It allows implementing photonic functions through the use of CMOS (Complementary Metal Oxide Semiconductor) compatible wafer-scale technologies on high quality, low cost silicon substrates. However, pure passive silicon waveguide devices still have limited performance in terms of insertion loss, phase noise (which results in channel crosstalk) and temperature dependency. This is due to the high refractive index contrast between the SiO2 (silicon dioxide) cladding and the Si (silicon) core, the non-uniform Si layer thickness and the large thermo-optic effect of silicon.

Silicon nitride-based passive devices offer superior performance. Propagation loss below 0.1 dB/cm has been demonstrated for waveguides with a 640 nm thick SiNx (silicon nitride) core and even below 0.1 dB/m for waveguides with a 50 nm thick core. Also, the slightly lower refractive index contrast between SiNx (n=2) and SiO2 (n=1.45) versus Si (n=3.5) and SiO2 (n=1.45) results in less phase noise and larger fabrication tolerances. This facilitates the fabrication of high performance but still very compact optical circuits such as AWGs (Arrayed Waveguide Gratings), ring resonators, etc. Silicon nitride waveguides have been reported both as a high performance passive waveguide layer on an active silicon photonics chip but also as 'stand-alone' passive optical chips. Due to their compact size, these circuits are ideal for the realization of low-cost receivers and transceivers. For these applications, however, either high speed detectors, or lasers and modulators are required. Lasers cannot be fabricated in the silicon platform whilst none are possible on the silicon nitride platform.

There are two solutions for this problem. Classically active devices made using InP/GaAs materials are flip-chipped or coupled to the passive waveguide circuit. This significantly increases the complexity of the chip, as externally coupled devices require active alignment. Alternatively, one can choose to bond a III-V film 111 to the passive waveguide circuit 120 to integrate the active devices 110 on the chip to obtain an integrated optical device 100 as shown in FIG. 1. The passive waveguide circuit 120 includes a hybrid waveguide structure 125 within a SOI (Silicon On Insulator) waveguide 121 and a tapered mode converter 123. The active device 110 includes a III-V diode with quantum wells 111 attached on a SOI circuit 113 and covered by metal contacts on silicon dioxide 115. The complexity of this integration stays approximately the same whether few or many components are integrated, as the processing of all the devices is done at wafer scale. This approach therefore becomes more and more effective as the chip complexity grows.

In most heterogeneously integrated active devices, adiabatic tapering is used to transfer light between the passive circuit and the active device. This taper is fabricated in the same epitaxial layers used to create the active devices. FIG. 2 shows a photograph depicting an exemplary adiabatic taper 200 in a III-V active device. In integrated detectors, the additional length in the taper increases the capacitance, reducing the possible device bandwidth. In integrated lasers, these tapers need to be pumped in order to avoid losses. However, in this case, the injected current flows near the etched sidewalls, thereby reducing the device lifespan. In integrated modulators, the residual absorption in the taper section cannot be avoided.

The main problems with the adiabatic taper as it is used so far are excess loss due to doping, increased device capacitance and need for pumping the tapers. Excess loss is related to doping and active region, especially for the modulator. Increased device capacitance can be resolved in the modulator by electrically insulating the taper sections from the main modulating section, however this approach is not possible in the detector. Need for pumping the tapers in integrated lasers is in order to avoid excessive losses. This probably reduces the lifespan of the laser. In monolithic III-V waveguide platforms, passive and active sections are made by selectively growing active waveguide sections (with MQW, Multiple Quantum Wells and doping), and passive waveguide sections (without MQW and doping).

FIG. 3 is a schematic 300 showing typical differences between active 301 and passive 311 regions for monolithic III-V waveguide platforms. The active region 301 includes a lower layer 307 of n-InP, a middle MQW layer 305 and an upper layer 303 of p-InP attached on a common n+-InP substrate 310. The passive region 311 includes a lower layer 317 of non-doped InP, a middle layer 315 of passive material, also called quaternary layer and an upper layer 313 of non-doped InP attached on the common n+-InP substrate 310.

However, using current heterogeneous integration techniques it is not possible to use a regrown III-V wafer. This is because the III-V material is bonded to the target wafer 'face-down' as shown in FIG. 4 illustrating the production process 400. The unprocessed III-V die 401 is attached 402 on top of the SOI photonic waveguide 403 by "face-down" bonding 404 providing a SOI waveguide with bonded III-V die 405. Note that the "face-down" bonding 404 of the III-V die 401 inverts the epi layers. Then, substrate is removed 406 and the thin film device 407 is ready for further processing. The uneven surface topology at the interface between passive and active areas prevents successful bonding using a regrown III-V wafer, i.e. applying "face-up" bonding.

There is a need to couple light between active devices and passive waveguide circuits, in particular by using high performance, low loss adiabatic tapers between III-V active devices heterogeneously bonded to a separate wafer containing passive waveguide structures.

SUMMARY

It is the object of the invention to provide techniques for coupling light between active devices and passive waveguide circuits.

This object is achieved by the features of the independent claims. Further implementation forms are apparent from the dependent claims, the description and the figures.

In order to describe the invention in detail, the following terms, abbreviations and notations will be used:
CMOS: Complementary Metal Oxide Semiconductor,
$SiO_2$: silicon dioxide,
$SiN_x$: silicon nitride,
AWGs: Arrayed Waveguide Gratings,
III-V: III-V compound semiconductors combined from group III elements, and group V elements of the periodic table of the elements,
MQW: Multiple Quantum Wells,
RI: Refractive Index,
SOI: Silicon On Insulator,
Q Quantum wells layer,
um: micro-meter.

According to a first aspect, the invention relates to a method for producing an integrated optical circuit comprising an active device and a passive waveguide circuit, the method comprising: applying an active waveguide structure on a source wafer substrate; exposing a portion of the source wafer substrate by selectively removing the active waveguide structure; applying a passive waveguide structure on the exposed portion of the source wafer substrate, wherein an aggregation of the active waveguide structure and the passive waveguide structure forms the active device, the active device having a bottom surface facing the source wafer substrate; removing the source wafer substrate from the active device; and attaching the active device to a target substrate comprising the passive waveguide circuit such that the bottom surface of the active device faces the target substrate.

By applying a passive waveguide structure on the exposed portion of the source wafer substrate regrowth techniques can be applied to create the taper sections in a passive material which results in low-loss tapers that can be very long, as the most significant loss contributions in the taper section (free carrier absorption, MQW absorption) can be removed. Using the method according to the first aspect allows for special tapering topographies to be used, such as a 3D taper structure. This is not possible without access to passive waveguides, as in such a taper structure the MQW region cannot be pumped. Using the method according to the first aspect allows for very long tapers with multiple tapering stages to taper adiabatically to a medium index contrast waveguide, as there is no associated absorption loss.

In a first possible implementation form of the method according to the first aspect, the method comprises using an intermediate substrate to attach the active device to the target substrate.

By using an intermediate substrate to attach the active device to the target substrate a flip-chip mounting can be avoided. Surfaces of the active device do not have to be reversed and uneven surfaces (bumps) of the active device can be efficiently handled.

In a second possible implementation form of the method according to the first aspect as such or according to the first implementation form of the first aspect, the method comprises using transfer printing to attach the active device to the target substrate.

By using transfer printing to attach the active device to the target substrate a flip-chip mounting can be avoided. Surfaces of the active device do not have to be reversed and uneven surfaces (bumps) of the active device can be efficiently handled.

In a third possible implementation form of the method according to the first aspect as such or according to any of the preceding implementation forms of the first aspect, applying the active waveguide structure on the source wafer substrate comprises growing a III-V thin-film on the source wafer substrate.

Growing a III-V thin-film on the source wafer substrate is a very efficient technique for coupling light between active devices and passive waveguide circuits.

In a fourth possible implementation form of the method according to the third implementation form of the first aspect, applying the passive waveguide structure on the exposed portion of the source wafer substrate comprises re-growing the III-V thin-film on the exposed portion of the source wafer substrate.

Regrowth allows for the definition of classical buried ridge lasers in bonded lasers. These have the advantage of a better heat spreading and passivation, and hence lead to better performing devices.

In a fifth possible implementation form of the method according to the fourth implementation form of the first aspect, the growing the III-V thin-film on the source wafer substrate comprises disposing a multiple quantum wells layer embedded in a doped layer structure over the source wafer substrate; and the re-growing the III-V thin-film on the exposed portion of the source wafer substrate comprises disposing a passive layer embedded in a non-doped layer structure over the exposed portion of the source wafer substrate. These embedded layers provide highly efficient light coupling.

In a sixth possible implementation form of the method according to the first aspect as such or according to any of the preceding implementation forms of the first aspect, the method comprises disposing a common contact layer on a top surface of the applied active and passive waveguide structures before attaching the active device to the target substrate, the top surface of the applied active and passive waveguide structures being opposite to the bottom surface of the active device.

The disposing the common contact layer on the active and passive waveguide structures can be applied prior to transfer of the active device to the target substrate. That facilitates manufacturing.

In a seventh possible implementation form of the method according to the sixth implementation form of the first aspect, the common contact layer comprises bumps at a top surface of the active device making the top surface uneven, the top surface of the active device being opposite to the bottom surface of the active device.

The transfer of the active device to the target substrate can be efficiently handled even if the top surface of the active device is uneven due to the bumps.

According to a second aspect, the invention relates to an integrated optical circuit comprising: a passive waveguide circuit; and an active device attached to the passive waveguide circuit such that a bottom surface of the active device faces the passive waveguide circuit, wherein the active device comprises an aggregation of an active waveguide structure comprising a grown III-V thin-film and a passive waveguide structure comprising a regrown III-V thin-film.

Using regrowth to create the taper sections in a passive material of the integrated optical circuit gives low-loss tapers that can be very long, as the most significant loss contributions in the taper section (free carrier absorption, MQW absorption) can be removed. The integrated optical circuit can implement special tapering topographies, such as a 3D taper structure. This is not possible without access to passive III-V waveguides, as in such a taper structure the MQW region cannot be pumped. The integrated optical circuit allows for very long tapers with multiple tapering stages to taper adiabatically to a medium index contrast waveguide, as there is no associated absorption loss. Regrowth allows for the definition of classical buried ridge lasers in bonded lasers. These have the advantage of a better heat spreading and passivation, and hence lead to better performing devices.

In a first possible implementation form of the integrated optical circuit according to the second aspect, the integrated optical circuit comprises a common contact layer arranged at a top surface of the active device, the top surface of the active device being opposite to the bottom surface of the active device, wherein the common contact layer comprises bumps making the top surface of the active device uneven.

The integrated optical circuit can be easily manufactured even if the top surface of the active device is uneven due to the bumps.

In a second possible implementation form of the integrated optical circuit according to the second aspect as such or according to the first implementation form of the second aspect, a section where the active device is attached to the passive waveguide circuit comprises a tapered structure.

The tapered structure is very efficient for coupling light from the active device to the passive waveguide circuit.

In a third possible implementation form of the integrated optical circuit according to the second implementation form of the second aspect, the tapered structure is formed in the passive waveguide structure of the active device.

When forming the tapered structure in the passive waveguide structure of the active device, light is very efficiently coupled from the active device to the passive waveguide circuit.

In a fourth possible implementation form of the integrated optical circuit according to the second or the third implementation form of the second aspect, the tapered structure comprises a 3D tapered structure.

3D tapered structures are very efficient to couple light from the active device to the passive waveguide circuit.

In a fifth possible implementation form of the integrated optical circuit according to the second aspect as such or according to any of the preceding implementation forms of the second aspect, the passive waveguide circuit comprises a core and a cladding covering the core, wherein a material of the core is one of a high index contrast material, in particular silicon, and a medium index contrast material, in particular one of SiN, SiON, Ta2O5 and SiC.

When using a high or medium index contrast material, light can be efficiently coupled from the active device to the passive waveguide.

In a sixth possible implementation form of the integrated optical circuit according to the second aspect as such or according to any of the preceding implementation forms of the second aspect, the integrated optical circuit comprises one of the following devices: an integrated detector, an integrated laser, an integrated modulator.

The integrated optical circuit can therefore efficiently realize a lot of circuits processing light.

According to a third aspect, the invention relates to a coupling scheme between heterogeneously integrated III-V active devices and medium or high index contrast waveguides where selective area regrowth is used to define active and passive waveguide regions on a III-V coupon prior to bonding; and a bonding is used that is based on intermediate handling, in particular an intermediate handling where the native substrate is removed, and then the epitaxy is placed on the target substrate such that the epi stack is not 'face-down' or inverted.

In a first possible implementation form of the coupling scheme according to the third aspect, the bonding is transfer printing.

In a second possible implementation form of the coupling scheme according to the third aspect, the high index contrast material is silicon.

In a third possible implementation form of the coupling scheme according to the third aspect, the medium index material is one of SiN, SiON, Ta2O5, SiC or other materials with refractive index in range 1.9-2.4.

In a fourth possible implementation form of the coupling scheme according to the third aspect, the required taper sections are defined between the passive circuit waveguide and the III-V in a passive III-V waveguide section, in order to avoid absorption losses and to reduce III-V active device capacitance.

In a fifth possible implementation form of the coupling scheme according to the third aspect, the passive taper is also vertically tapered.

In a sixth possible implementation form of the coupling scheme according to the third aspect, the regrowth is used to define a classical buried ridge laser structure prior to bonding. The increased InP area will improve thermal dissipation and reduce the impact of device heating.

Aspects of the invention relate to heterogeneous wafer bonding of III-V actives onto a second wafer. The second wafer may contact the passive structures. The III-V chips may be selectively regrown prior to transfer. Then, transfer printing or other intermediate handle techniques may be used to create very efficient tapers.

Using regrowth to create the taper sections in a passive material gives low-loss tapers that can be very long, as the most significant loss contributions in the taper section (free carrier absorption, MQW absorption) can be removed. Using methods and devices as described in this disclosure allows for special tapering topographies to be used, such as a 3D taper structure. This is not possible without access to passive III-V waveguides, as in such a taper structure the MQW region cannot be pumped. Using methods and devices as described in this disclosure allows for very long tapers with multiple tapering stages to taper adiabatically to a medium index contrast waveguide, as there is no associated absorption loss. Regrowth allows for the definition of classical buried ridge lasers in bonded lasers. These have the advantage of a better heat spreading and passivation, and hence lead to better performing devices.

BRIEF DESCRIPTION OF THE DRAWINGS

Further embodiments of the invention will be described with respect to the following figures, in which:

FIGS. 9a and 9b shows schematic diagrams illustrating a side view of adiabatic tapers using passive tapers with vertical tapers coupled to a medium index contrast waveguide, e.g. SiN according to an implementation form, wherein FIG. 9a depicts a first structure 900a and FIG. 9b a second structure 900b of the adiabatic taper;

FIG. 14 shows a schematic diagram illustrating an integrated device 1400 with a waveguide cross-section at end of taper when the taper is fabricated in the passive material according to an implementation form;

FIGS. 15a and 15b show schematic diagrams illustrating an integrated device 1500 using a vertical taper in a passive taper to enable coupling between III-V and a medium index contrast waveguide according to an implementation form in a top view (FIG. 15a) and a side view (FIG. 15b)

DETAILED DESCRIPTION OF EMBODIMENTS

Figure 1:
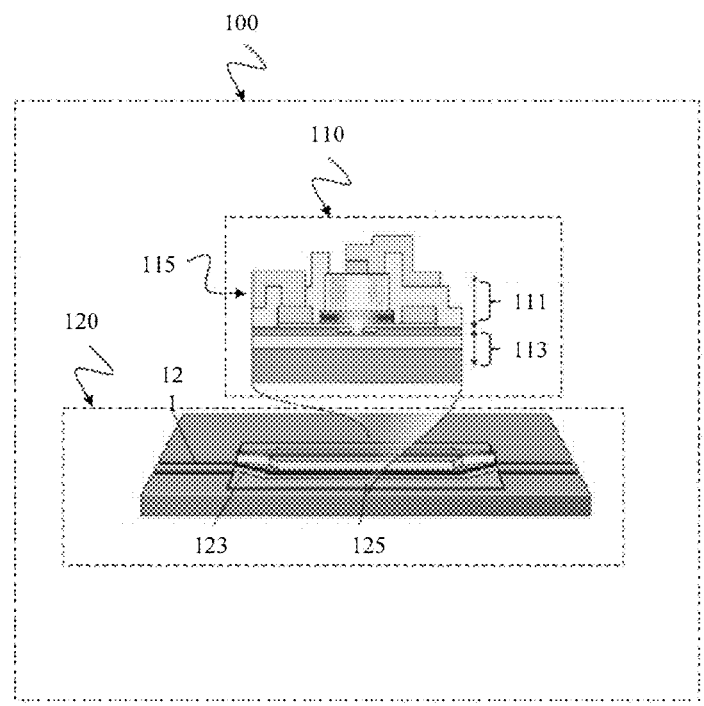
FIG. 1 shows a block diagram illustrating an integrated optical circuit 100 in which the active devices 110 are integrated on the chip by bonding a III-V film 111 to a passive waveguide circuit 120.
Figure 2:
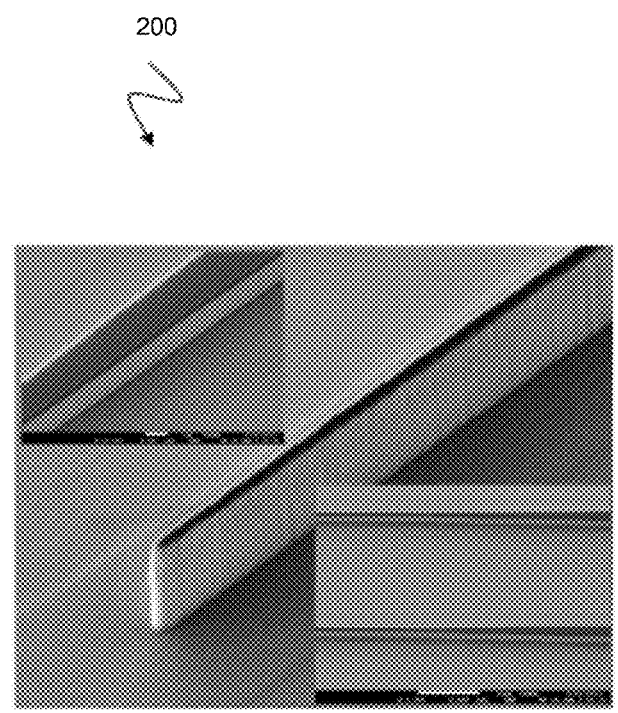
FIG. 2 shows a photograph depicting an exemplary adiabatic taper 200 in a III-V active device.

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

The devices and methods described herein may be based on active devices and passive optical waveguides. It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The methods and devices described herein may be implemented for producing integrated optical chips. The described devices and systems may include software units and hardware units. The described devices and systems may include integrated circuits and/or passives and may be manufactured according to various technologies. For example, the circuits may be designed as logic integrated circuits, analog integrated circuits, mixed signal integrated circuits, optical circuits, memory circuits and/or integrated passives.

In the following detailed description methods and devices using III-V materials are described. III-V compound semiconductors may be obtained by combining group III elements, for example Al, Ga, In, with group V elements, for example N, P, As, Sb. This may result in about 12 possible combinations for the above exemplary elements; the most important ones are probably GaAs, InP GaP and GaN. In the examples described below, InP is used as an exemplary member of a III-V material. It is understood that the use of InP is only an example, any other combination from a group III element with a group V element, e.g. such as for example GaAs, GaP or GaN can be used as well.

In the following description methods and devices using thin films and growing/re-growing of epitaxial (epi) layers are described. A thin film is a layer of material ranging from fractions of a nanometer to several micrometers in thickness. Applying a thin film to a surface is also called thin-film deposition. Any technique for depositing a thin film of material onto a substrate or onto previously deposited layers is referred to as thin-film deposition. "Thin" is a relative term, but most deposition techniques control layer thickness within a few tens of nano-meters. Epitaxy refers to the deposition of a crystalline overlayer on a crystalline substrate. The overlayer is also called an epitaxial (epi) film or epitaxial layer. In some applications, it may be desired that the deposited material forms a crystalline overlayer that has one well-defined orientation with respect to the substrate crystal structure. Epitaxial films may be grown or re-grown from gaseous or liquid precursors. Because the substrate acts as a seed crystal, the deposited film may lock into one or more crystallographic orientations with respect to the substrate crystal.

In the following description methods and devices using AWGs are described. Arrayed waveguide gratings are lightwave circuits that may be used as optical multiplexers or demultiplexers in optical systems such as wavelength division multiplexed (WDM) systems. AWGs are capable of multiplexing a large number of wavelengths into a single optical fiber, thereby increasing the transmission capacity of optical networks. AWGs may be planar lightwave circuits that may be fabricated by depositing doped and undoped layers of silica on a silicon substrate.

In the following description methods and devices using MQWs are described. MQWs are structures with a very thin, e.g. about 10 nm thick layer of bulk semiconductor material sandwiched between two barrier regions of a higher bandgap material. This restricts the motion of the electrons and holes and forces energies for motion to be quantized and only occur at discrete energies.

Figure 5A:
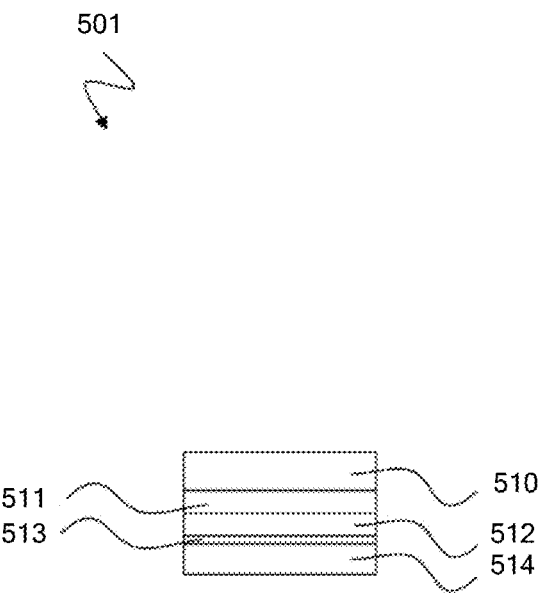
FIGS. 5a) to 5g) show production steps 501, 502, 503, 504, 505, 506, 507 of a method for producing an integrated optical chip according to an implementation form.

FIGS. 5a) to 5g) show processing steps 501, 502, 503, 504, 505, 506, 507 of a method for producing an integrated optical circuit including an active device and a passive waveguide circuit according to an implementation form.

As described below with respect to FIGS. 5a to 5g in more detail, the method generally includes the following: applying 501 an active waveguide structure 510, 511, 512 on a source wafer substrate 514; exposing 502 a portion 522 of the source wafer substrate 514 by selectively removing the active waveguide structure 510, 511, 512; applying 503 a passive waveguide structure 531, 532, 533 on the exposed portion 522 of the source wafer substrate 514, wherein an aggregation of the active waveguide structure 510, 511, 512 and the passive waveguide structure 531, 532, 533 forms the active device 550, the active device 550 having a bottom surface facing the source wafer substrate 514; removing 505 the source wafer substrate 514 from the active device 550; and attaching 506 the active device 550 to a target substrate 562 comprising the passive waveguide circuit such that the bottom surface of the active device 550 faces the target substrate 562. An intermediate substrate 612 may be used 600 to attach the active device 550 to the target substrate 562. Transfer printing 722 may be used to attach the active device 550 to the target substrate 562. Applying 501 the active waveguide structure 510, 511, 512 on the source wafer substrate 514 may include growing a III-V thin-film on the source wafer substrate 514. Applying 503 the passive waveguide structure 531, 532, 533 on the exposed portion 522 of the source wafer substrate 514 may include re-growing the III-V thin-film on the exposed portion 522 of the source wafer substrate 514. The growing the III-V thin-film on the source wafer substrate 514 may include disposing a multiple quantum wells layer embedded in a doped layer structure over the source wafer substrate 514; and the re-growing the III-V thin-film on the exposed portion 522 of the source wafer substrate 514 may include disposing a passive layer embedded in a non-doped layer structure over the exposed portion (522) of the source wafer substrate 514. The method may include disposing 504 a common contact layer 541, 543 on a top surface of the applied active and passive waveguide structures before attaching the active device to the target substrate, the top surface of the applied active and passive waveguide structures being opposite to the bottom surface of the active device. The common contact layer 541, 543 may include bumps 543 at a top surface of the active device 550 making the top surface uneven, wherein the top surface of the active device is opposite to the bottom surface of the active device.

FIG. 5a shows a first processing step 501 of applying an active waveguide structure 510, 511, 512 on a source wafer substrate 514. Applying the active waveguide structure may be performed by growing the active waveguide structure, e.g. by thin-film growing, for example by growing a III-V thin-film on the source wafer substrate 514. The active waveguide structure may include a first or lower layer 512, e.g. made of n-InP, a second or middle layer 511 formed as an active multi quantum wells layer and a third or top layer 510, e.g. made of p-InP. These layers 512, 511, 510 are attached on a source wafer substrate 514, e.g. made of InP. A release layer 513 may be used for attaching the active waveguide structure 510, 511, 512 on the source wafer substrate 514.

Figure 5B:
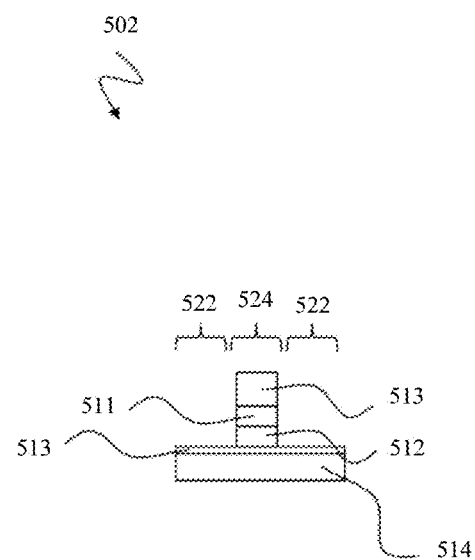

FIG. 5b shows a second processing step 502 of exposing a portion of the source wafer substrate by selectively removing the active waveguide structure. Removing can be an etching, grinding or thinning of the active waveguide structure including the first layer 512, the second layer 511 and the third layer 510 as described with respect to FIG. 5a. In the example of FIG. 5b removing does not include the release layer 513. In another example removing may include the release layer 513. After the selectively removing processing step 502 the active waveguide structure 510, 511, 512 is removed from first areas 522, i.e. exposed portions of the source wafer substrate 514 and not removed from second areas 524 of the source wafer substrate 514. In FIG. 5b the first areas 522 are surrounding the second area 524 thereby forming an inner stripe or band of active waveguide material on the source wafer substrate 514. However, any other configuration is possible, for example a plurality of small stripes or bands of active waveguide structures 510, 511, 512 on the source wafer substrate 514.

Figure 5C:
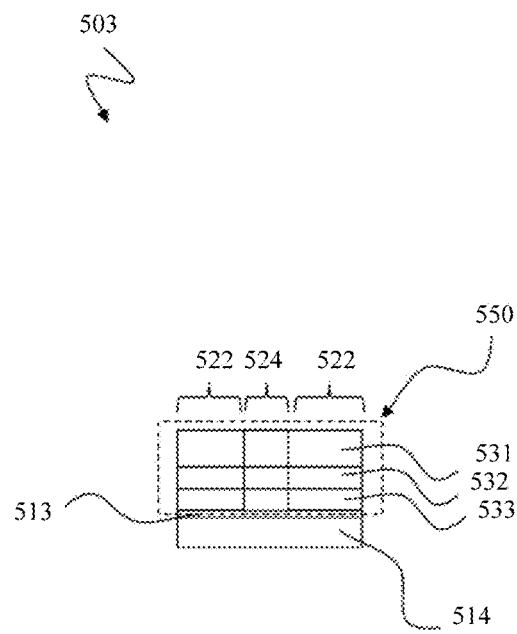

FIG. 5c shows a third processing step 503 of applying a passive waveguide structure on the exposed portions 522 of the source wafer substrate 514. Applying the passive waveguide structure may be performed by re-growing the passive waveguide structure, e.g. by thin-film re-growing, for example by re-growing a III-V thin-film on the exposed portions 522 of the source wafer substrate 514.

The passive waveguide structure may include a first or lower layer 533, e.g. made of InP (non-doped), a second or middle layer 532 formed as a passive (quaternary) layer and a third or top layer 531, e.g. made of InP (non-doped). These layers 533, 532, 531 are attached on the exposed portions 522 of the source wafer substrate 514. The release layer 513 may be used for attaching the passive waveguide structure 533, 532, 531 on the source wafer substrate 514.

By applying the passive waveguide structure 533, 532, 531 on the exposed portions 522 beneath the portions 524 holding the active waveguide structure 510, 511, 512 an aggregation of the active waveguide structure and the passive waveguide structure is formed which constitutes the active device 550. The active device 550 has a bottom surface facing the source wafer substrate 514 and an upper surface opposite to the bottom surface.

Figure 5D:
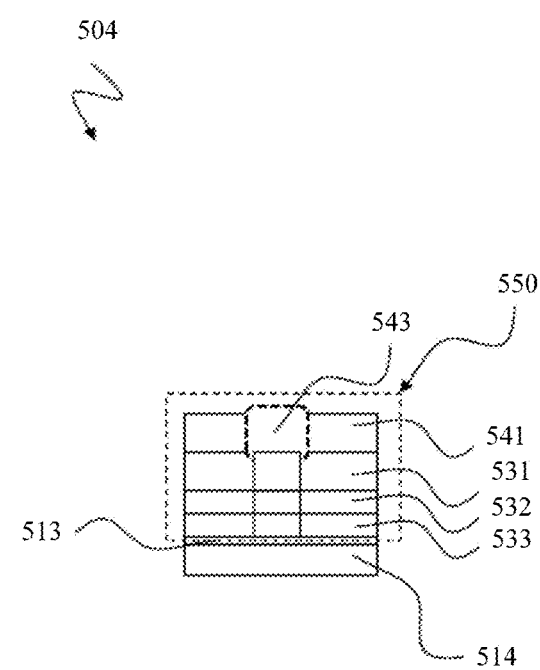

FIG. 5d shows a fourth processing step 503 of attaching common top contact layers 541, 543 on the active device 550 and implanting regions 543 of the common top contact layers 541, 543, e.g. by doping. Attaching the common top contact layers 541, 543 may be performed by disposing a thin film contact layer on the active device 550, e.g. by thin-film re-growing and forming bumps in the contact layer. The non-implanted regions 541 of the top contact layer may be formed from a non-doped InGaAs/InP layer. The implanted regions 543 of the top contact layer may be formed from a doped InGaAs/InP layer. The region 541 of the contact layers may be formed from the same material as the top layer 531 of the passive waveguide structure. Such a processing may result in an uneven surface of the common contact layers 541, 543. After the attaching of the common top contact layers 541, 543 the active device 550 includes these layers.

Figure 5E:
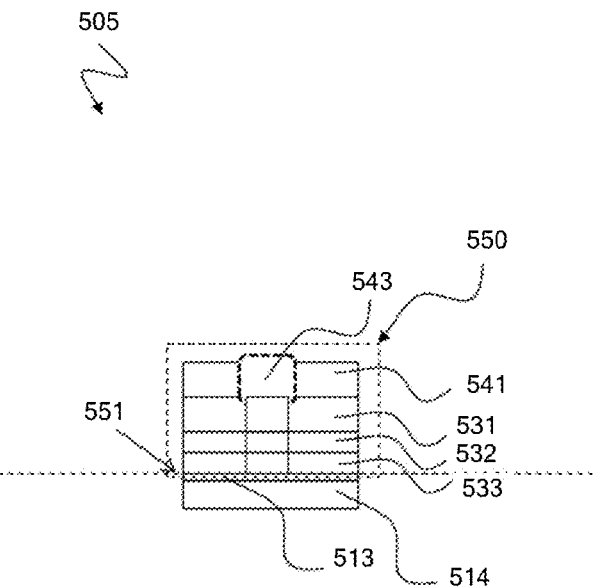

FIG. 5e shows a fifth processing step 505 of removing the source wafer substrate 514 from the active device 550, e.g. by opening up and releasing the InP coupons. The removing may be performed by removing the release layer 513 which is attached between active device 550 and source wafer substrate 514 thereby releasing the bonding of active device 550 and source wafer substrate 514.

Figure 5F:
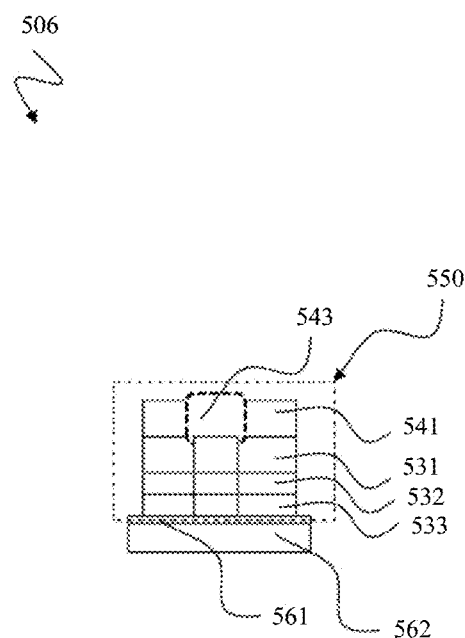

FIG. 5f shows a sixth processing step 506 of transferring the active device 550 to a target substrate 562 and attaching the active device 550 on the target substrate 562 such that the bottom surface of the active device 550 faces the target substrate 562. The target substrate 562 may include the passive waveguide circuit on which the active device 550 is to be attached to. An optional bonding layer 561 is attached on the target substrate 562 on which bonding layer 561 the active device 550 may be attached.

Figure 6:
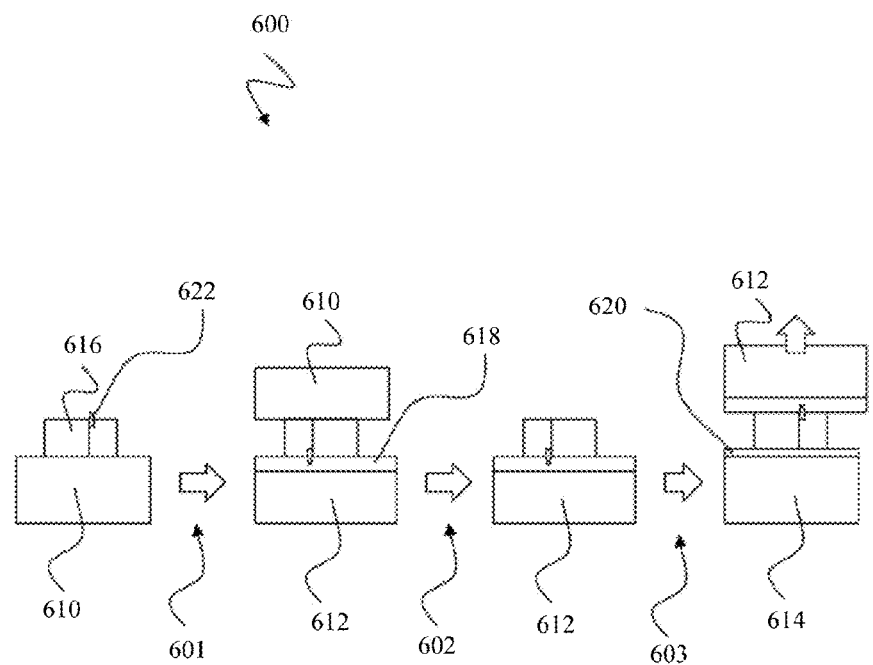
FIG. 6 shows a schematic diagram of productions steps 601, 603, 605 of a method 600 for heterogeneous wafer bonding using an intermediate handle wafer according to an implementation form.

Transferring the active device 550 to the target substrate 562 may be performed by different processing techniques such as for example wafer bonding 600 using an intermediate handle wafer as described below with respect to FIG. 6 or by wafer bonding 700 using an elastomer stamp as described below with respect to FIG. 7.

Figure 5G:
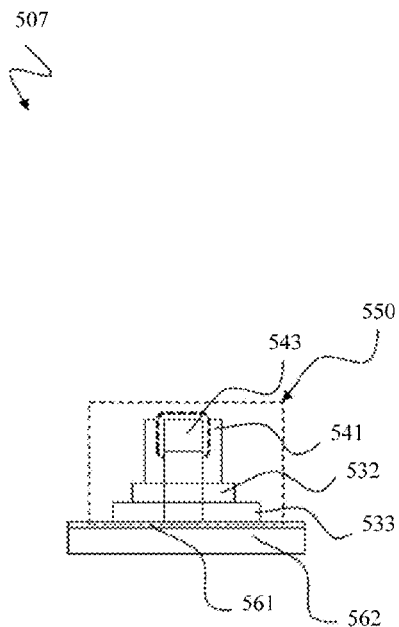

FIG. 5g shows a seventh processing step 507 of post-processing the device including active device 550 and target substrate 562. The layers 533, 532, 541 may be thinned to form a tapered structure FIG. 6 shows a schematic diagram of productions steps 601, 603, 605 of a method 600 for heterogeneous wafer bonding using an intermediate handle wafer according to an implementation form.

In a first processing step 601 the source wafer substrate 610 including the active device 616 is bonded temporarily to an intermediate substrate 612, e.g. by using a temporary bonding layer 618 such that a first surface of the active device not facing the source wafer substrate 610 is attached to the intermediate substrate 612. Then, in a second processing step 602 the substrate of the original wafer, i.e. the source wafer substrate 610 is thinned, e.g. by etching, grinding, etc. In a third processing step 603 the intermediate substrate 612 with the active device 616 is bonded to the target substrate 614 such that a second surface of the active device opposite to the first surface which second surface has been thinned from the source wafer substrate 610 is attached to the target substrate 614 and the intermediate substrate 612 is released. This approach can be used for heterogeneous integration as shown in FIG. 6. In this case the epitaxy order is not reversed as the first surface and the second surface of the active device do not have to be reversed from the first processing step 601 to the third processing step 603. Therefore the regrowth notch 622 does not cause a problem for wafer bonding.

Therefore this solution enables the use of passive waveguides in the adiabatic tapers used for optical coupling of light between III-V active devices heterogeneously bonded onto a different wafer containing passive waveguides. A high performance machine may be used for temporarily wafer bonding. It allows performing the method 600 for transferring small III-V coupons on non-native substrates with a high throughput. When applied to heterogeneous integration the method 600 describes one example of how to transfer the III-V using an intermediate handle wafer substrate.

The processing steps 601, 603, 605 for heterogeneous wafer bonding using an intermediate handle wafer may be used for transferring the active device 550 from the source wafer substrate 514 to the target substrate 562 as described above with respect to FIG. 5f.

Figure 7:
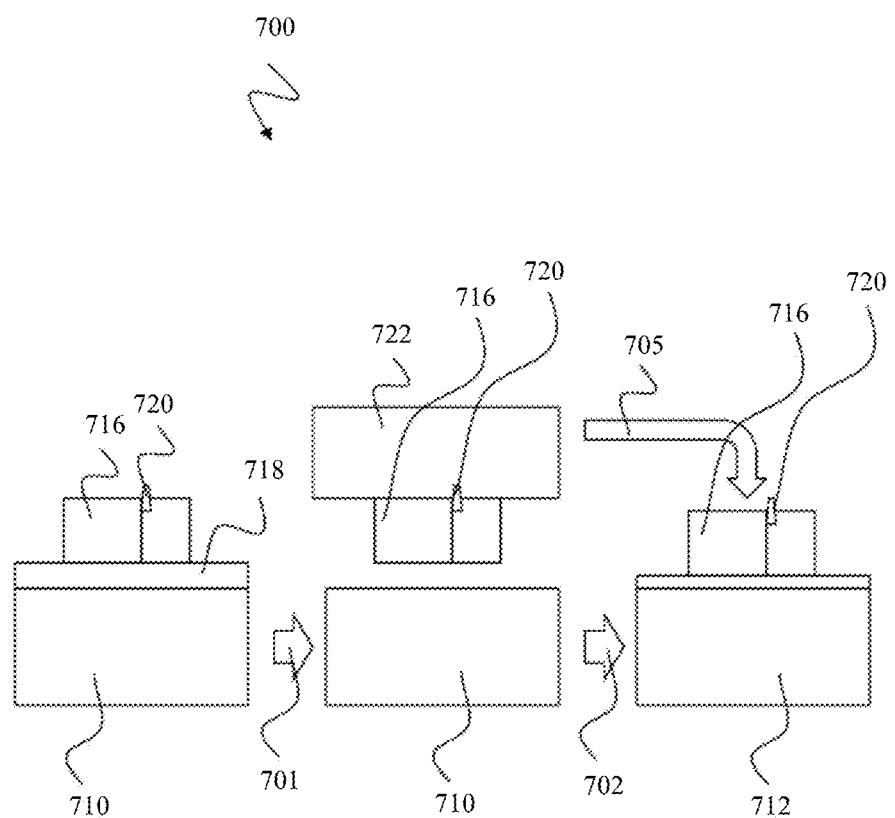
FIG. 7 shows a schematic diagram of productions steps 701, 703 of a method 700 for wafer bonding using an elastomer stamp according to an implementation form.

FIG. 7 shows a schematic diagram of productions steps 701, 703 of a method 700 for wafer bonding using an elastomer stamp according to an implementation form.

In a first processing step 701 an elastomer stamp 722 is temporarily attached to the source wafer substrate 710 including the active device 716 such that a first surface of the active device 716 not facing the source wafer substrate 710 is attached to the elastomer stamp 722. The sacrificial layer 718 bonding the active device 716 to the source wafer substrate 710 is released, e.g. by etching. As a result of this first processing step 701 the active device 716 is temporarily attached to the elastomer stamp 722 and can be transferred 705 to the target substrate 712 in a second processing step 702 and finally the elastomer stamp 722 is released. This approach can be used for heterogeneous integration as shown in FIG. 7. In this case the epitaxy order is not reversed as the first surface of the active device 716 not facing the source wafer substrate 710 does not have to be reversed from the first processing step 701 to the second processing step 702. Therefore the regrowth notch 720 does not cause a problem for wafer bonding.

Therefore this solution enables the use of passive waveguides in the adiabatic tapers used for optical coupling of light between III-V active devices heterogeneously bonded onto a different wafer containing passive waveguides. A high performance machine may be used for micro-transfer printing. It allows for picking and placing small III-V coupons on non-native substrates with a high throughput. When applied to heterogeneous integration the method 700 describes one example of how to transfer the III-V using an elastomer stamp 722 as an intermediate 'handle'.

The processing steps 701, 702 for heterogeneous wafer bonding using an elastomer stamp for wafer bonding may be used for transferring the active device 550 from the source wafer substrate 514 to the target substrate 562 as described above with respect to FIG. 5f.

Figure 8A:
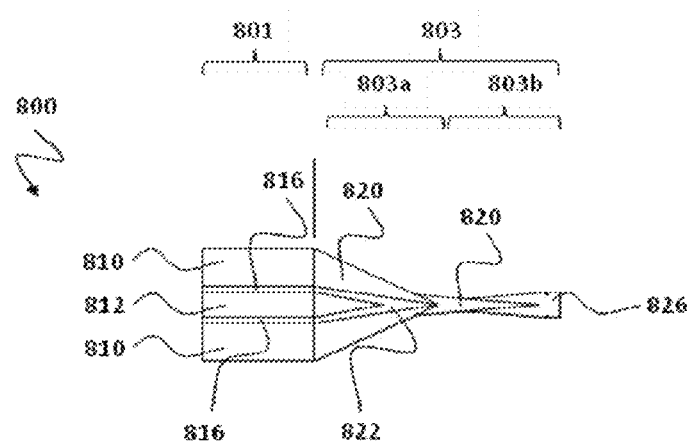
FIGS. 8a and 8b show schematic diagrams illustrating adiabatic tapers using passive tapers coupled to a silicon waveguide in a top view (FIG. 8a) and a side view (FIG. 8b) according to an implementation form.
Figure 8B:
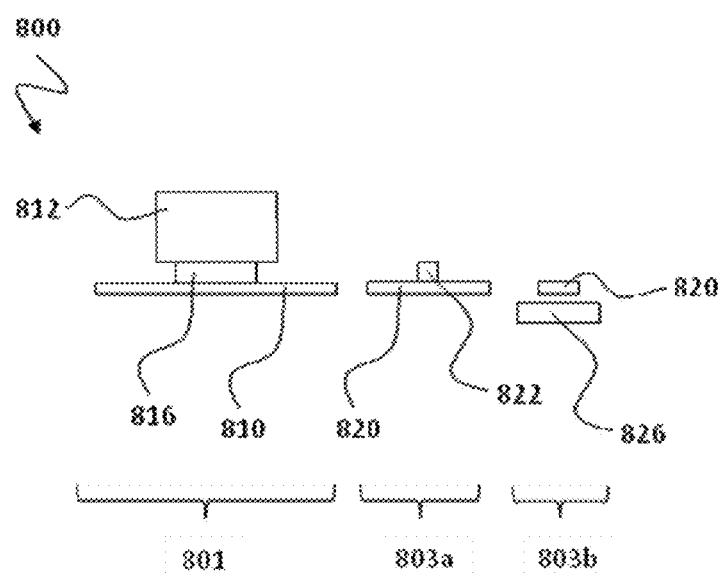

FIGS. 8a and 8b show schematic diagrams illustrating an adiabatic taper 800 using a passive taper coupled to a silicon waveguide in a top view (FIG. 8a) and a side view (FIG. 8b) according to an implementation form.

After bonding of the III-V devices (active device 550) to the wafer (target substrate 562) containing the passive structures and subsequent processing to create the tapers as described above with respect to FIGS. 5a to 5g, the structures may look as schematically depicted in FIGS. 8a and 8b.

Figure 3:
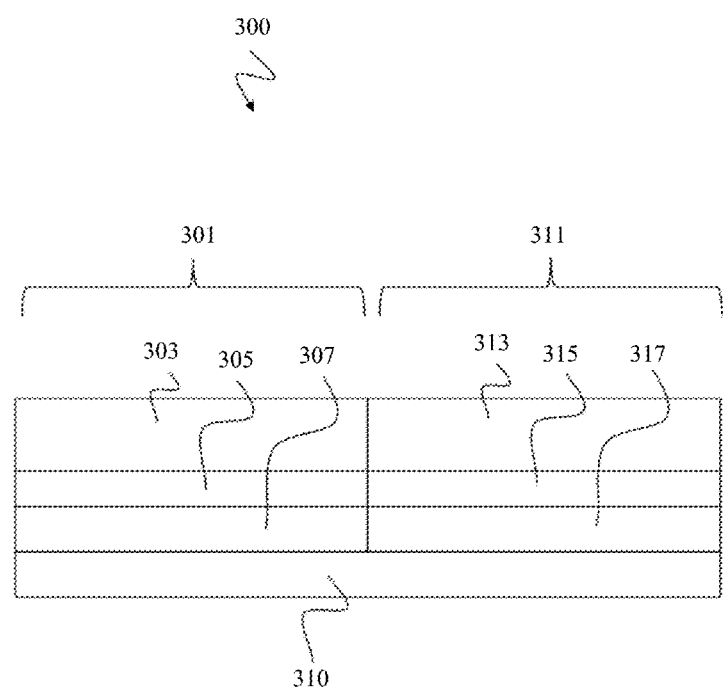
FIG. 3 shows a schematic diagram 300 illustrating typical differences between active 301 and passive 311 regions for monolithic III-V waveguide platforms.
Figure 4:
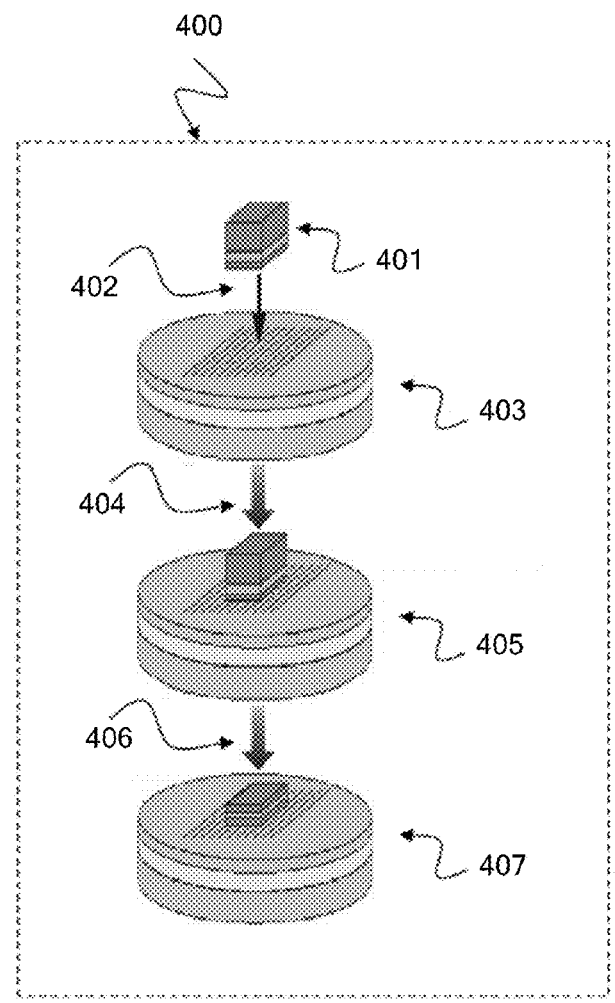
FIG. 4 shows a schematic diagram illustrating a production process 400 for bonding a III-V material to a target wafer in a 'face-down' manner.

The adiabatic taper 800 includes an active area 801 and a passive area 803. The active area 801 may include a first layer 812, e.g. formed of p-InP, arranged above a second layer 816, e.g. a multiple quantum wells layer arranged above a third layer 810, e.g. formed of n-InP. The layer arrangement may correspond to the representation of the active region 301 described above with respect to FIG. 3.

The taper is formed in the passive area 803 that may include a first section 803a and a second section 803b. The first section 803a of the passive area 803 may include a first layer 820, e.g. formed of i-InP and a second layer 822 above the first layer 810, which second layer 822 may be formed as a quaternary passive layer. The arrangement of the layers may correspond to the representation of the passive region 311 described above with respect to FIG. 3.

The second section 803b of the passive area 803 may include a continuation of the second layer 822 of the first section 803a arranged above a silicon substrate 826 forming the waveguide.

Figure 9A:
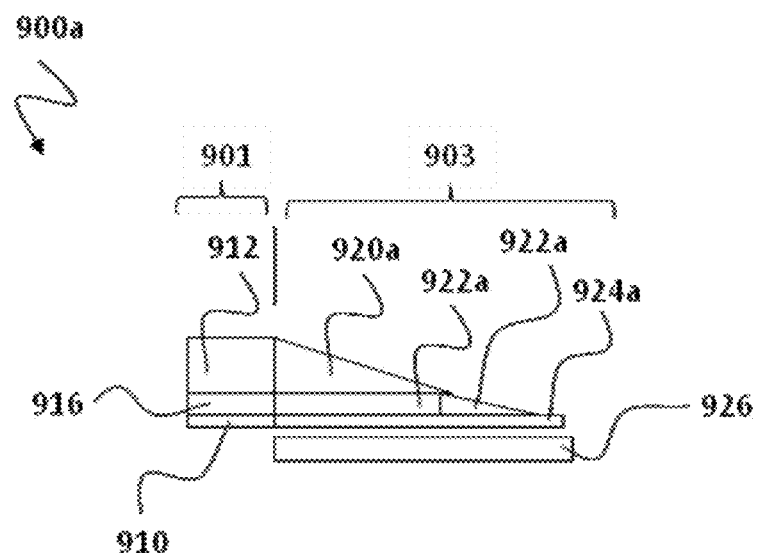
Figure 9B:
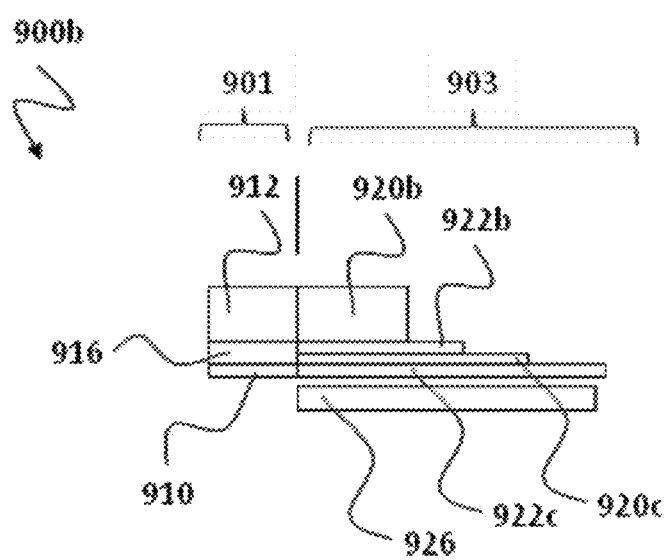

FIGS. 9a and 9b shows schematic diagrams illustrating a side view of adiabatic tapers 900a, 900b using passive tapers with vertical tapers coupled to a medium index contrast waveguide, e.g. SiN according to an implementation form, wherein FIG. 9a depicts a first structure 900a and FIG. 9b a second structure 900b of the adiabatic taper.

Using regrowth also enables tapers suitable for direct coupling between heterogeneously integrated III-V actives on medium index contrast waveguides (e.g. SiN) without the need for an intermediate silicon layer. This can be achieved by using a vertical taper in the passive waveguide as depicted in FIG. 9.

The adiabatic taper 900a according to the first structure includes an active area 901 and a passive area 903. The active area 901 may include a first layer 912, e.g. formed of p-InP, arranged above a second layer 916, e.g. a multiple quantum wells layer arranged above a third layer 910, e.g.

formed of n-InP. The layer arrangement may correspond to the representation of the active region 301 described above with respect to FIG. 3.

The taper is formed in the passive area 903 that may include a first layer 920a, e.g. formed of InP (non-doped) above a second layer 922a, e.g. formed as a quaternary passive layer above a third layer 924a, e.g. formed of InP (non-doped). The arrangement of the layers may correspond to the representation of the passive region 311 described above with respect to FIG. 3. The three layers 920a, 922a, 924a are arranged over a medium index contrast waveguide 926, e.g. formed of SiN, SiON, Ta2O5 or SiC.

The adiabatic taper 900b according to the second structure includes an active area 901 and a passive area 903. The active area 901 may include a first layer 912, e.g. formed of p-InP, arranged above a second layer 916, e.g. a multiple quantum wells layer arranged above a third layer 910, e.g. formed of n-InP. The layer arrangement may correspond to the representation of the active region 301 described above with respect to FIG. 3.

The taper is formed in the passive area 903 that may include a first layer 920b, e.g. formed of InP (non-doped) above a second layer 922b, e.g. formed as a quaternary passive layer above a third layer 920c that may be composed of the same material than the first layer 920b above a fourth layer 922c that may be composed of the same material than the second layer 922b. The four layers 920b, 922b, 920c, 922c may be arranged over a medium index contrast waveguide 926, e.g. formed of SiN, SiON, Ta2O5 or SiC.

While the first structure of the adiabatic taper 900a shown in FIG. 9a is continuously tapering, the second structure of the adiabatic taper 900b shown in FIG. 9b is discontinuously tapering, i.e. in a step-like manner.

FIGS. 9a and 9b show that using regrowth to create active and passive waveguides in heterogeneously integrated III-V on medium index contrast waveguides allows for special tapering topographies to be used, such as a 3D taper structure. This is not possible without access to passive III-V waveguides, as in such a taper structure the MQW region cannot be pumped. Using regrowth further allows implementing very long tapers with multiple tapering stages to taper adiabatically to a medium index contrast waveguide, as there is no associated absorption loss.

Figure 10A:
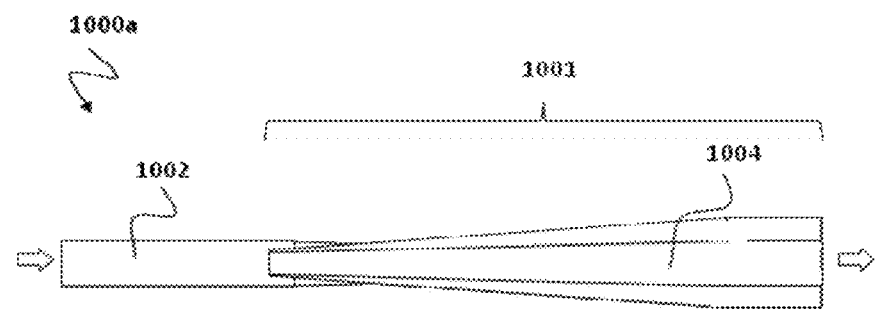
FIGS. 10a and 10b show schematic diagrams illustrating a comparison of taper design (EA modulator to silicon) using either active tapers (FIG. 10a) or using passive tapers (FIG. 10b) according to an implementation form.
Figure 10B:
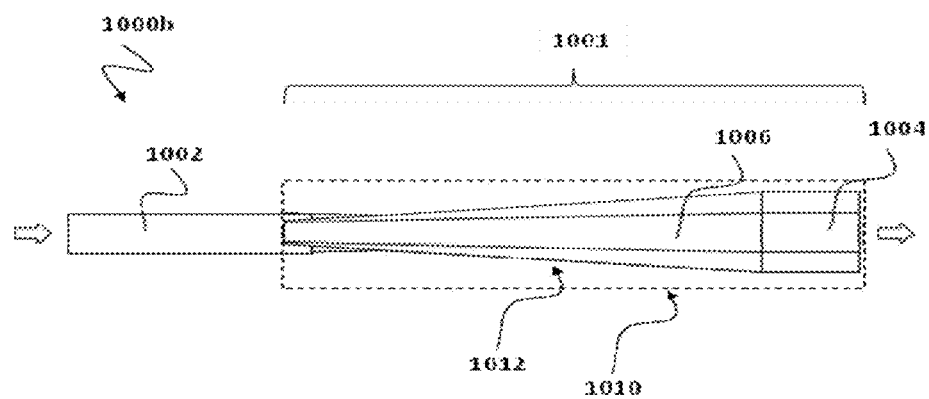

FIGS. 10a and 10b show schematic diagrams illustrating a comparison of taper design (EA modulator to silicon) using either active tapers (FIG. 10a) or using passive tapers (FIG. 10b) according to an implementation form in a top view.

FIG. 10a depicts the case of no regrowth, where the active waveguide 1004 is everywhere in the taper section 1001 while FIG. 10b depicts the case of regrowth, where the passive waveguide 1006 is beneath the active waveguide 1004 in the taper section 1001. For both taper designs the taper section 1001 is beneath the Si substrate layer 1002. The passive waveguide 1006 may be structured according to the structure of the passive region 311 described above with respect to FIG. 3. The active waveguide 1004 may be structured according to the structure of the active region 301 described above with respect to FIG. 3. The taper design shown in FIG. 10b may be produced by the method described above with respect to FIGS. 5a to 5g.

A taper design using no regrowth according to FIG. 10a is applied for the devices 1100 and 1200 described below with respect to FIGS. 11 and 12. A taper design using regrowth according to FIG. 10b is applied for the devices 1300 and 1400 described below with respect to FIGS. 13 and 14.

FIG. 10b also shows an integrated optical circuit 1000b including a passive waveguide circuit 1002 and an active device 1010 attached to the passive waveguide circuit 1002 such that a bottom surface of the active device 1010 faces the passive waveguide circuit 1002. The active device 1010 includes an aggregation of an active waveguide structure 1004 including a grown III-V thin-film and a passive waveguide structure 1006 including a regrown III-V thin-film.

The integrated optical circuit 1000b may be produced by the method described above with respect to FIGS. 5a to 5g and may correspond to the device shown in FIG. 5g. The integrated optical circuit 1000b may include a common contact layer 541, 543 arranged at a top surface of the active device 1010, wherein the top surface of the active device 1010 is opposite to the bottom surface of the active device 1010. The common contact layer 541, 543 may include bumps 543 making the top surface of the active device 1010 uneven. A section of the integrated optical circuit 1000b where the active device 1100 is attached to the passive waveguide circuit 1002 may include a tapered structure 1012. The tapered structure 1012 may be formed in the passive waveguide structure 1006 of the active device 1010. This can also be seen from FIGS. 8 and 9 where a side view of an integrated optical circuit is depicted that may correspond to the integrated optical circuit 1000b depicted in FIG. 10b. The tapered structure 1012 may include a 3D tapered structure, i.e. a tapering in all three dimensions.

The passive waveguide circuit 1002 may include a core and a cladding covering the core.

In one example the material of the core may be silicon. In one example the material of the cladding may be example SiO2 (silicon dioxide). In one implementation, the material of the core may be a high index contrast material, for example silicon. In one implementation, the material of the core may be a medium index contrast material, for example SiN, SiON, Ta2O5 or SiC.

A high index contrast material is a material providing a high refractive index contrast between the material of the cladding, for example SiO2 (silicon dioxide) having a refractive index n=1.45 and the material of the core, for example Si (silicon) having a refractive index n=3.5.

A medium index contrast material is a material providing a medium refractive index contrast between the material of the cladding, for example SiO2 (silicon dioxide) having a refractive index n=1.45 and the material of the core, for example SiNx having a refractive index n=2.

The implementation of the integrated optical circuit based on the medium index contrast material provides a high performance in terms of insertion loss, phase noise (which results in low channel crosstalk) and temperature dependency. Silicon nitride-based passive devices offer superior performance. Propagation losses below 0.1 dB/cm are possible for waveguides with a 640 nm thick SiNx (silicon nitride) core and even below 0.1 dB/m for waveguides with a 50 nm thick core. Also, the slightly lower refractive index contrast between SiNx (n=2) and SiO2 (n=1.45) versus Si (n=3.5) and SiO2 (n=1.45) results in less phase noise and larger fabrication tolerances. This makes the fabrication of high performance but still very compact integrated optical circuits 100b such as AWGs, ring resonators possible. Integrated optical circuits based on silicon nitride waveguides may be implemented both as a high performance passive waveguide layer on an active silicon photonics chip but also as 'stand-alone' passive optical chips.

In one example, the integrated optical circuit 1000b may be an integrated detector. In one example, the integrated optical circuit 1000b may be an integrated laser. In one example, the integrated optical circuit 1000*b* may be an integrated modulator, for example as described below with respect to FIGS. 13 to 16.

Figure 11:
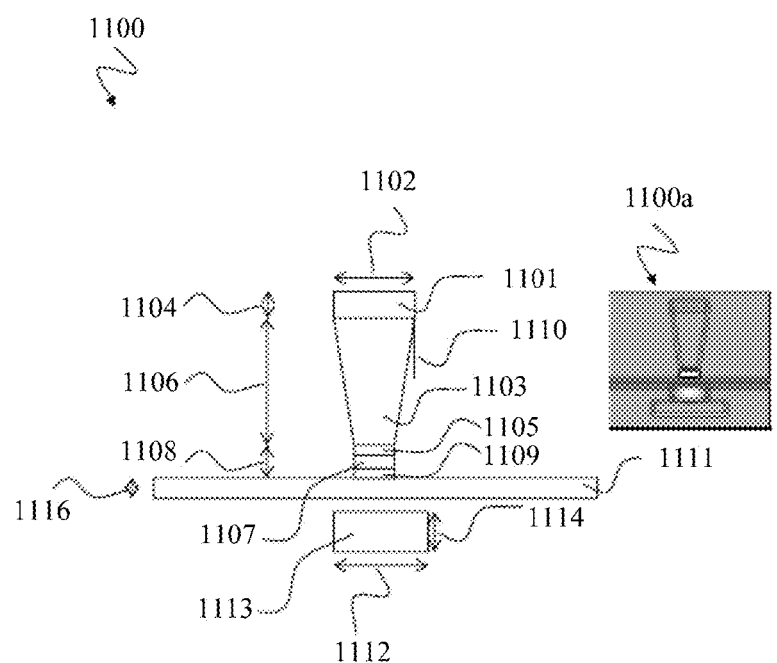
FIG. 11 shows a schematic diagram illustrating an integrated device 1100 with a taper tip when the taper is formed without regrowth in the same active epi used for the modulator.

FIG. 11 shows a schematic diagram illustrating an integrated device 1100 with a taper tip when the taper is formed without regrowth in the same active epi used for the modulator.

A tapered p-InP layer 1103 of 1800 nm height 1106 is arranged on a first layer 1105 of InGaAsP(Q1.2) SCH that is arranged on a second layer 1107 of 9×11 nm InGaAsP (Q1.49) QW that is arranged on a third layer 1109 of 8×7 nm InGaAsP(Q1.2) QW. A height 1108 of the three layers 1105, 1107, 1109 is 350 nm. The tapered p-InP layer 1103 has a length 1102 of 1.0 um at the tip and continuously reduces its length under an angle 1110 of 8 degrees, e.g. produced by wet etching, from tip to bottom which bottom is arranged on the three layers 1105, 1107, 1109. The three layers 1105, 1107, 1109 have the same length that is thinner than the tip length 1102 of the tapered p-InP layer 1103. A p-InGaAs layer 1101 of 200 nm height 1104 and 1.0 um (micro-meter) length is attached at the tip of the tapered p-InP layer 1103. The three layers 1105, 1107, 1109 together with the layers 1103, 1101 are arranged on an n-InP layer 1111 of 150 nm height 1116 that is arranged above a silicon substrate 1113 of dimensions 400 nm height 1114 and 1 um length 1112.

The picture 1100*a* illustrates an efficiency of light coupling when the integrated device 1100 is used.

Figure 12:
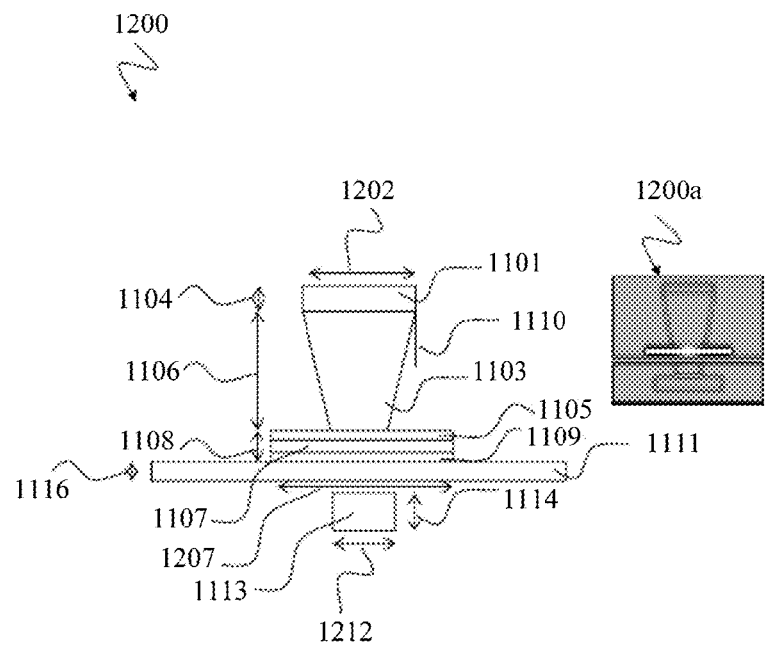
FIG. 12 shows a schematic diagram illustrating an integrated device 1200 with a taper at end of taper when the taper is formed without regrowth in the same active epi used for the modulator.

FIG. 12 shows a schematic diagram illustrating an integrated device 1200 with a taper at end of taper when the taper is formed without regrowth in the same active epi used for the modulator. The structure of the integrated device 1200 corresponds to the structure of the integrated device 1100 described above with respect to FIG. 11. However, the length 1202 of the tapered p-InP layer 1103 at the tip is 1.5 um and the length 1207 of the three layers 1105, 1107, 1109 is 2.5 um and different from the length of the tapered p-InP layer 1103 at its bottom. Further, the length 1212 of the silicon substrate 1113 is 0.75 um.

The picture 1200*a* illustrates an efficiency of light coupling when the integrated device 1200 is used.

Figure 13:
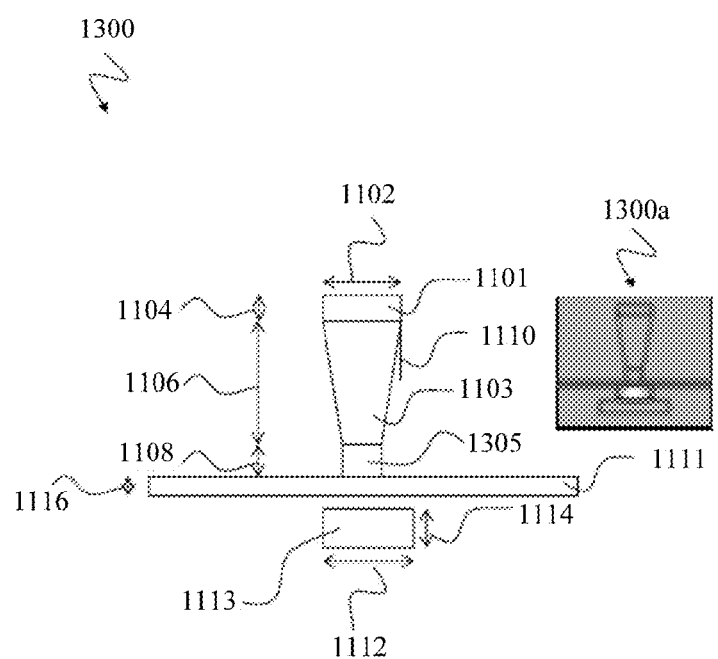
FIG. 13 shows a schematic diagram illustrating an integrated device 1300 with a waveguide cross-section taper tip when the taper is fabricated in the passive material according to an implementation form.

FIG. 13 shows a schematic diagram illustrating an integrated device 1300 with a waveguide cross-section taper tip when the taper is fabricated in the passive material according to an implementation form.

The dimensions correspond to the dimensions of the integrated device 1100 described above with respect to FIG. 11. However the three layers 1105, 1107, 1109 are implemented as a single layer 1305 formed of InGaAsP(Q1.3), the tapered layer 1103 is formed of In-P, the layer 1101 is formed of InGaAs and the layer 1111 is formed of InP.

The picture 1300*a* illustrates an efficiency of light coupling when the integrated device 1300 is used.

FIG. 14 shows a schematic diagram illustrating an integrated device 1400 with a waveguide cross-section at end of taper when the taper is fabricated in the passive material according to an implementation form.

The dimensions correspond to the dimensions of the integrated device 1200 described above with respect to FIG. 12. However the three layers 1105, 1107, 1109 are implemented as a single layer 1405 formed of InGaAsP(Q1.3), the tapered layer 1103 is formed of In-P, the layer 1101 is formed of InGaAs and the layer 1111 is formed of InP.

The picture 1400*a* illustrates an efficiency of light coupling when the integrated device 1400 is used.

FIGS. 15*a* and 15*b* show schematic diagrams illustrating an integrated device 1500 using a vertical taper in a passive taper to enable coupling between III-V and a medium index contrast waveguide according to an implementation form in a top view (FIG. 15*a*) and a side view (FIG. 15*b*). FIGS. 15*a* and 15*b* describe a 3D taper to SiN.

The passive taper section 1501 includes a first section 1505, a second section 1507 and a third section 1509. In the first section 1505 a first layer 1513 of InP increases its length from 0.4 um to 1.2 um. The first layer 1513 has a thickness of 50 nm and is placed above an SiN carrier 1511 of length 2 um and thickness 405 nm.

In the second section 1507 a second (quaternary) layer 1517 is disposed on the first layer 1513 of InP. A thickness of the second layer 1517 continuously increases from 0 to a thickness of 450 nm and a length increase from 1.2 um to 1.5 um. The thickness of the first layer 1513 is constant (50 nm) in the second section 1507.

In the third section 1509 a third layer 1519 of InP is disposed on the second (quaternary) layer 1517. The thickness of the first layer 1513 is constant (50 nm) in the third section 1509. The thickness of the second layer 1517 is constant (450 nm) in the second section 1509. The thickness of the third layer 1519 is constant (1.8 um) in the second section 1509.

In the active section 1503 a first layer 1523 formed of InP that has a length of 1.5 um is disposed on a second (Q) layer 1521 having a length of 2.5 um.

Figure 16:
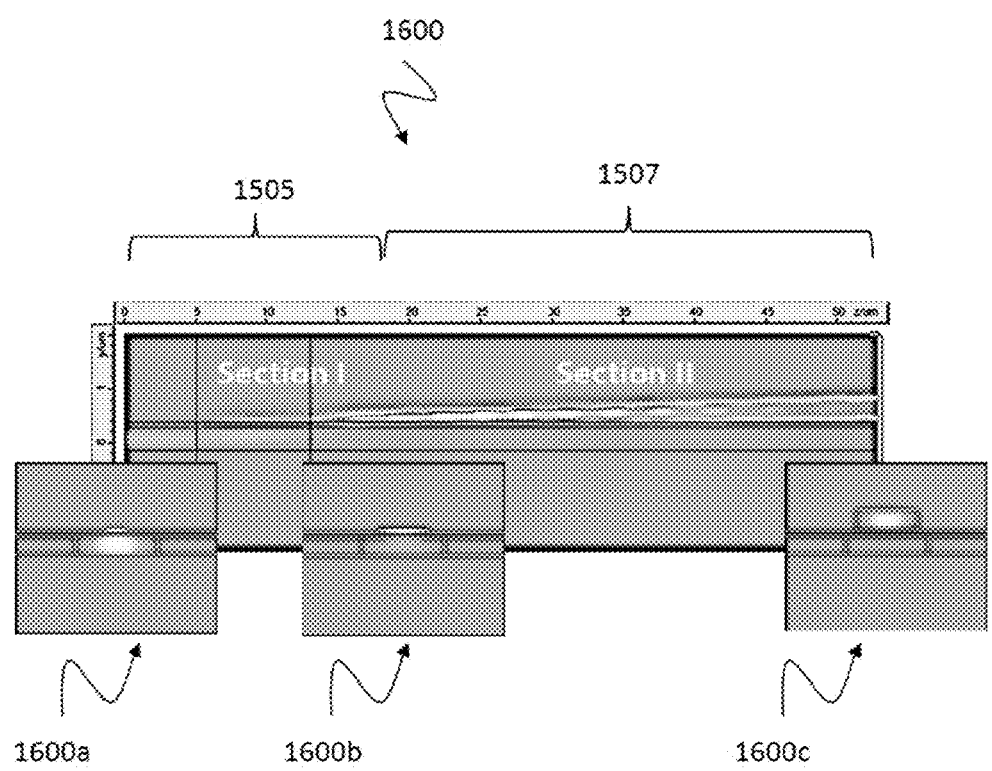
FIG. 16 shows a schematic diagram illustrating coupling efficiency between the TE1 mode on the input waveguide and TE0 mode on the upper output waveguide for the integrated device 1500 shown in FIG. 15.

FIG. 16 shows a schematic diagram illustrating coupling efficiency between the TE1 mode on the input waveguide and TE0 mode on the upper output waveguide for the integrated device 1500 shown in FIG. 15. In Section I 1505 a tapering length of 8 um for adiabatic transition is used. In Section II 1507 a tapering length of 40 um for adiabatic transition (combined with section I, this gives in total a loss of <0.07 dB) is used. In Section III 1509 a tapering length of 20 um for adiabatic transition (loss<0.04 dB) is used. The passive to active transition is the same as in the example of FIG. 15.

The picture 1600*a* illustrates an efficiency of light coupling at the beginning of Section I 1505. The picture 1600*b* illustrates an efficiency of light coupling between Section I 1505 and Section II 1507. The picture 1600*c* illustrates an efficiency of light coupling between Section II 1507 and Section III 1509.

The methods, systems and devices described herein may be implemented as hardware circuit within a chip or an integrated circuit or an application specific integrated circuit (ASIC) of a Digital Signal Processor (DSP). The invention can be implemented in digital and/or analogue electronic circuitry.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A method for producing an integrated optical circuit comprising an active device and a passive waveguide circuit, the method comprising:
    applying an active waveguide structure on a source wafer substrate;
    exposing a portion of the source wafer substrate by selectively removing the active waveguide structure;
    applying a passive waveguide structure on the exposed portion of the source wafer substrate, wherein an aggregation of the active waveguide structure and the passive waveguide structure forms the active device, the active device having a bottom surface facing the source wafer substrate;
    removing the source wafer substrate from the active device; and
    attaching the active device to a target substrate comprising the passive waveguide circuit such that the bottom surface of the active device faces the target substrate,
    wherein applying the active waveguide structure on the source wafer substrate comprises growing a III-V thin-film on the source wafer substrate, and
    wherein applying the passive waveguide structure on the exposed portion of the source wafer substrate comprises re-growing the III-V thin-film on the exposed portion of the source wafer substrate.

2. The method of claim 1, comprising:
using an intermediate substrate to attach the active device to the target substrate.

3. The method of claim 1, comprising:
using transfer printing to attach the active device to the target substrate.

4. The method of claim 1,
wherein the growing the III-V thin-film on the source wafer substrate comprises disposing a multiple quantum wells layer embedded in a doped layer structure over the source wafer substrate; and
wherein the re-growing the III-V thin-film on the exposed portion of the source wafer substrate comprises disposing a passive layer embedded in a non-doped layer structure over the exposed portion of the source wafer substrate.

5. The method of claim 1, comprising:
disposing a common contact layer on a top surface of the applied active and passive waveguide structures before attaching the active device to the target substrate, the top surface of the applied active and passive waveguide structures being opposite to the bottom surface of the active device.

6. The method of claim 5,
wherein the common contact layer comprises bumps at a top surface of the active device making the top surface uneven, the top surface of the active device being opposite to the bottom surface of the active device.

* * * * *